United States Patent [19]

Tomatsu

[11] Patent Number: 4,893,010
[45] Date of Patent: Jan. 9, 1990

[54] IMAGE RECORDING APPARATUS
[75] Inventor: Yoshiya Tomatsu, Ichinomiya, Japan
[73] Assignee: Brother Kogyo Kabushiki Kaisha, Japan
[21] Appl. No.: 217,632
[22] Filed: Jul. 12, 1988
[30] Foreign Application Priority Data
Jul. 15, 1987 [JP] Japan .................. 62-176849
[51] Int. Cl.⁴ ............................ G01U 15/00
[52] U.S. Cl. .................. 250/318; 250/319; 250/317.1; 346/160.1
[58] Field of Search ............... 250/316.1, 318, 319, 250/311; 346/76 R, 76 PH, 139 A, 139 D, 160; 355/32, 88

[56] References Cited
U.S. PATENT DOCUMENTS

| 4,737,822 | 4/1988 | Taniguchi et al. | 250/318 |
| 4,785,316 | 11/1988 | Yamamoto et al. | 346/150 |
| 4,785,332 | 11/1988 | Nagumo et al. | 250/318 |
| 4,800,275 | 1/1989 | Shimizu et al. | 250/318 |

Primary Examiner—Carolyn E. Fields
Assistant Examiner—John A. Miller
Attorney, Agent, or Firm—Oliff & Berridge

[57] ABSTRACT

An image recording apparatus which produces an image on a photosensitive recoding medium through a light shieldable mask image carried on a light transmissive member. The apparatus comprises; a mask image forming means provided at a mask image forming zone for forming the light shieldable mask on the light transmissive member; exposure means for exposing the photosensitive recording medium to light through the light transmissive member carrying the mask in an exposure zone for forming a latent image corresponding to the mask image on the photosensitive recording medium, the mask image forming zone being identical with the exposure zone; developing means for developing the latent image into a visible image on the photosensitive recording medium; and, a holding means for selectively holding portions of the light transmissive member extending outside of the exposure zone and maintaining the light transmissive member in the exposure zone during the mask image formation and during the exposure.

12 Claims, 3 Drawing Sheets

IMAGE RECORDING APPARATUS

BACKGROUND OF THE INVENTION

The present invention relates to a recording apparatus for forming an image in the form of letters, graphic figures or the like on a photosensitive recording medium with using a mask member formed of a light transmissive member on which a light shielding mask image is carried.

Generally known recording apparatus for use as color copying machines may be classified into silver-salt photographic recording apparatus, thermal transfer recording apparatus and electrophotographic recording apparatus. The silver-salt photographic recording apparatus can produce images of good quality but requires a long period of time for forming an image and are expensive to manufacture. The thermal transfer recording apparatus produces images of poor color reproducibility, since they are formed by overlapping three colors. The electrophotographic recording apparatus can copy an image at highest speed with high resolution, but are expensive and requires high running cost due to maintenance.

To overcome the aforesaid drawbacks of the conventional image recording apparatus, there has been proposed a recording apparatus of another type which can produce images of good color reproducibility and which is inexpensive and facilitates maintenance. In this recording apparatus, mask members based on image data in red, green, and blue are printed on a thermosensitive recording sheet by a thermal head, and a photosensitive pressure sensitive recording medium or sheet coated with coloring materials is exposed to light successively through the mask members to form a latent image on the photosensitive pressure sensitive sheet. Thereafter, the latent image is developed into a visible color image under pressure. Such image recording apparatus using the light shieldable mask member is also disclosed in commonly assigned copending U.S. patent application Ser. Nos. 50,313, now U.S. Pat. No. 4,810,614, filed on May 14, 1987 and 157,740, now U.S. Pat. No. 4,785,316, filed on Feb. 18, 1988.

In the image recording apparatus of the another type, it is of vital importance to position the three different mask members exactly with respect to the identical portion of the photosensitive pressure sensitive sheet. This positioning process is technically highly difficult to achieve, since the accuracy level has to be quite high such as within an error of 20 $\mu$m or less. Unless the mask members are positioned highly accurately with respect to the photosensitive pressure sensitive sheet, no sharp and detailed color image will be formed on the sensitive sheet.

SUMMARY OF THE INVENTION

In view of the above described drawbacks and disadvantages, it is an object of this invention to provide an image recording apparatus which can form an image exactly in a desired position on a photosensitive recording medium.

Another object of this invention is to provide such improved image recording apparatus which is inexpensive and requires easy maintenance.

To attain these objects the present invention provides an image recording apparatus which produces an image on a photosensitive recording medium through a light shieldable mask image carried on a light transmissive member. The apparatus comprises a mask image forming means, exposure means, developing means, and holding means. The mask image forming means is provided at a mask image forming zone for forming the light shieldable mask on the light transmissive member. The light shieldable mask corresponds to one of color informations. The exposure means is adapted for exposing the photosensitive recording medium to light through the light transmissive member carrying the mask in an exposure zone for forming a latent image on the photosensitive recording medium corresponding to the mask image. The mask image forming zone is identical with the exposure zone. The developing means is provided at downstream side of the exposure means and is adapted for developing the latent image into a visible image on the photosensitive recording medium, and the holding means is adapted for selectively holding the light transmissive member at portions extending outside of the exposure zone and for maintaining the light transmissive member stationary in the exposure zone during the mask image formation and during the exposure.

Since the light-shielding image is formed by the mask image forming means on the light transmissive member at the exposure zone where exposure to the photosensitive pressure sensitive recording medium is conducted, it is unnecessary to feed the light transmissive mask carrying member into the exposure zone. In other words, since the light shieldable mask image is produced at the light exposure zone, it is not necessary to perform position adjustment between the mask member and the photosensitive pressure sensitive recording medium which is also positioned at the exposure zone. After the mask image is formed on the light transmissive member at the exposure zone, the photosentive recording medium is then exposed to light which passes through the mask member, so that the latent image is formed on the photosensitive medium. The latent image-carrying photosensitive recording medium is then developed by the developing means to thereby obtain a visible color image. According to the copending U.S. Patent applications, the exposure unit is positioned at downstream side of the mask forming zone, and therefore, the mask carrying member must be delivered to the exposure zone so as to be aligned with the photosensitive recording medium at the exposure zone. However, according to the present invention, since the mask carrying member does not undergo feeding, but the light exposure is achieved at the position identical with the mask forming place, exact positioning is automatically provided between the mask carrying member and the photosensitive recording medium. Further, since no separate mechanism for positioning the light-transmissive mask carrying member with respect to the photosensitive recording medium is required, the recording apparatus becomes inexpensive to manufacture and compact in size, and maintenance to the apparatus is easily achievable.

DETAILED DESCRIPTION OF THE PREFERRED EMBODIMENTS

Figure 1:
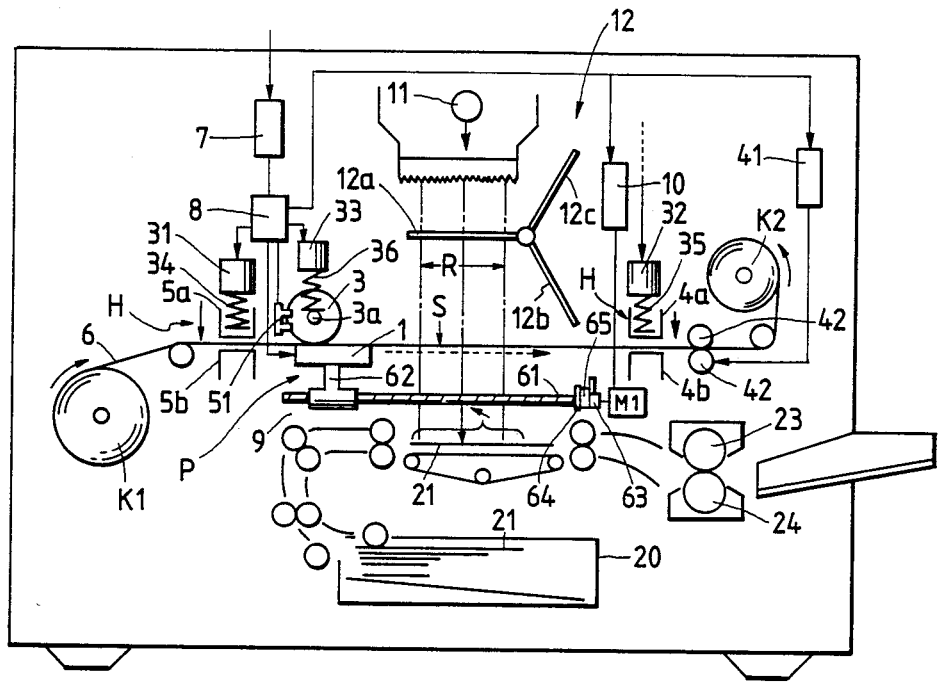
FIG. 1 is a schematic vertical cross-sectional view showing an image recording apparatus according to the present invention.

FIG. 1 shows a recording apparatus according to this invention for use as a color copying machine. The color copying machine has a light source 11 such as a fluorescent lamp disposed on an upper central position in an entire housing of the copying machine. Below the fluorescent lamp 11, there is disposed a color separation filter 12 including a red filter 12a, a green filter 12b and a blue filter 12c for forming respective mask images on a light transmissive member 6 such as a thermosensitive recording sheet on a basis of respective color informations.

A sheet holding means H is provided for selectively holding portions of the light transmissive member 6 extending outside of an exposure zone R and maintaining a segment of the light transmissive member in the zone R stationary during mask image forming process and during the exposure process in accordance with each color informations. The sheet holding means H includes elongated support members 4a, 4b and 5a, 5b (see FIG. 2) is positioned immediately below the filter 12 for holding the thermosensitive recording sheet 6 under tension at area outside of an exposure zone R. The support members 4a, 4b and the support members 5a, 5b are formed of elastic material and are spaced horizontally from each other. More specifically, the thermosensitive recording sheet 6 is fixed in position under tension by the support members 4a, 4b and 5a, 5b those gripping the sheet 6 therebetween. The support members 4a and 5a are biased downwardly as indicated by the arrows in FIG. 1 toward the respective opponent support members 4b and 5b by the solenoids 32 and 31 respectively through the respective compression springs 35, 34.

The thermosensitive recording sheet 6 is of a continuous web form and is supplied from a sheet supply roll K1 disposed in a lefthand (as shown in FIG. 1) position in the machine housing and fed to a sheet takeup roll K2 disposed in a righthand position in the machine housing, by means of feed rollers 42 rotatable by a motor M2 (FIG. 2) drivable by a motor driver 41 (FIG. 1).

Figure 2:
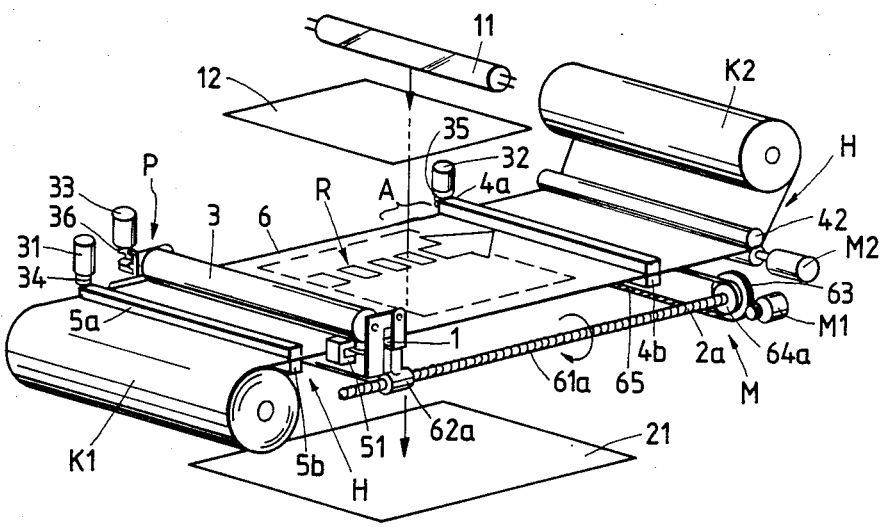
FIGS. 2, 3 and 4 are perspective views showing essential portions of the recording apparatus according to this invention; and, FIGS. 5 and 6 are schematic elevational views showing operation of the recording apparatus of the present invention.
Figure 3:
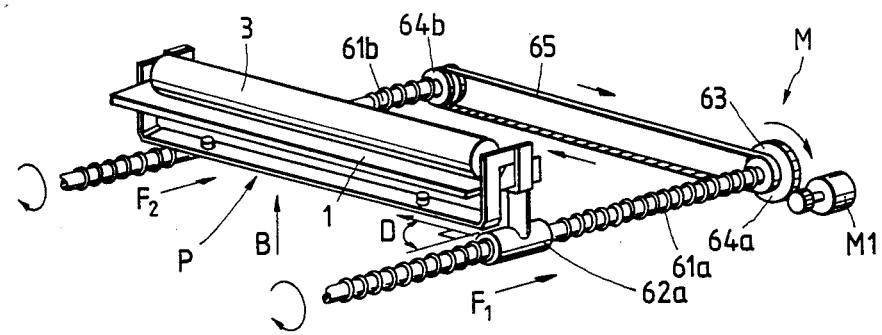
Figure 4:
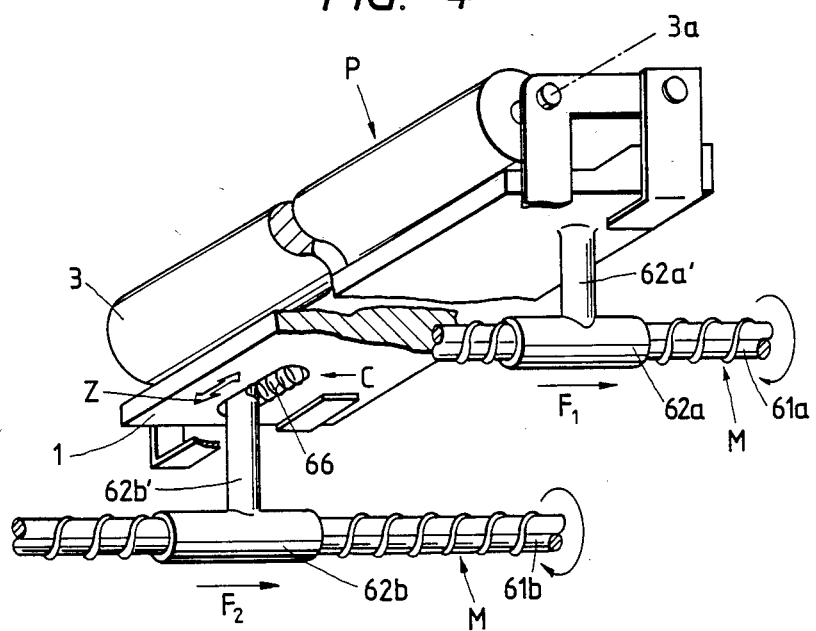

A mask image forming means P is movably disposed centrally in the machine housing between the support members 4a, 4b and the support members 5a, 5b. The mask image forming unit P includes a thermal print head 1, which is a line thermal head, and a platen 3 between which the thermosensitive recording sheet 6 are pinched under pressure. A solenoid 33 is connected to the platen 3 through a coil spring 36 so as to selectively bias the platen toward the thermal head 1. As also shown in FIGS. 2, 3 and 4, the mask image forming unit P further includes a moving unit M including a pair of sleeve nuts 62a, 62b (functioned as guide members 62 in FIG. 1) threadingly engaged with a pair of lead screws 61a, 61b (indicated by 61 in FIG. 1), respectively, extending horizontally between the support members 4a, 4b and the support members 5a, 5b and spaced horizontally from each other. The sleeve nuts 62a, 62b support the print head 1 and the platen 3. The printing head can be moved on and along the lead screws 61 by energizing a stepping motor M1 to rotate the lead screws 61 about their own axes.

As shown in FIG. 4, the sleeve nuts 62a on the lead screw 61a has an upstanding leg 62a' extending in a direction normal to the longitudinal direction of the thermal head 1. The leg 62a' has an upper end fixed to the thermal head 1. The sleeve nut 62b on the lead screw 61b has an upstanding leg 62b' with its upper end accommodated in a slot C defined in the thermal head 1 and held in position by a compression spring 66 disposed in the slot C.

The thermosensitive recording sheet 6 is pressed between the thermal head 1 and the platen 3 which is pressed toward the thermal head 1. The platen 3 itself is idly rotatable with respect to its shaft 3a, so that the platen 3 is rotated by friction with the thermosensitive sheet 6 as the thermal head 1 is fed in the auxiliary scanning direction along the lead screws 61a, 61b.

A sheet cassette 20 storing a stack of photosensitive pressure-sensitive sheets 21 of paper is disposed in a lower central position in the machine housing. A photosensitive pressure-sensitive sheet 20 delivered from the sheet cassette 20 is positioned below the thermosensitive sheet 6 and an area defined between the support members 4a, 4b and the support members 5a, 5b in vertical alignment with the light source 11, the filter 12 and the thermosensitive recording sheet 6. As best shown in FIG. 1, the photosensitive pressure-sensitive sheet 20 is then exposed to light emitted from the light source 11 through the filter 12 and the thermosensitive sheet 6, after which the photosensitive pressure-sensitive sheet 20 is fed between pressure developing rollers 23, 24 located in a lower righthand position in the machine housing, and then discharged out of the copying machine. This photosensitive pressure-sensitive sheet P is so called self-contained type recording medium in which an encapsulated chromogenic material or dye precursor and a developer material are co-deposited on one surface of a single substrate as one layer or as two continuous layers. Such self-contained type recording medium is generally disclosed in U.S. Pat. No. 4,440,846. However, instead of the self-contained type recording medium, a transfer type recording medium is also available in the present invention. In the transfer type medium, the developer material is coated on a separate substrate as a separate developer or copy sheet as typically disclosed in U.S. Pat. No. 4,399,209. In the latter case, another sheet cassette is provided for storing the separate developer sheet so as to provide facial contact between the developer sheet and the microcapsule carrying sheet effected with light irradiation through the mask member at a position upstream of the pressure developing rollers, so that a visible image is provided at the developer sheet upon rupture of the microcapsules.

According to the invention, there is further provided a moving means which includes the stepping motor M1, for moving the thermal head 1 from the print starting position S to the right in the auxiliary scanning direction indicated by the arrow (FIG. 1) while the thermal head 1 is printing an image line by line based on a color data from the control unit 8 on the thermosensitive sheet 6. The stepping motor M1 is operatively coupled to a timing pulley 64a through a gear 63, and the timing pulley 64a is operatively coupled to another timing pulley 64b (see FIG. 3) through an endless belt 65. The stepping motor M1 is energized to turn a given number of steps by a motor driver 10. The timing pulleys 64a, 64b are coaxially coupled to ends of the lead screws 61a, 61b, respectively, which are located outside of the exposure zone R, for rotating the lead screws 61a, 61b about their own axes in synchronism with the timing pulleys 64a, 64b. Rotation of the lead screws 61a, 61b is converted into linear movement of the sleeve nuts 62a, 62b coupled to the thermal head 1 to produce forces F1, F2 (FIGS. 3 and 4) along the lead screws 61a, 61b. Further, a photo-interrupter 51 is positioned outside of the exposure zone R for detecting the thermal head position.

Image data of red, green, and blue are produced from a colored original by means of an input device or image reading mechanism, which is omitted from illustration. First, the red image data is sent through a data input unit 7 and a control unit 8 to the thermal head 1 of the printing unit P. Then, the thermal head 1 prints the red image data on the thermosensitive recording sheet 6 which is sandwiched between the thermal head 1 and the platen 3 disposed thereover.

In the illustrated embodiment, the thermal head 1 is moved in the auxiliary scanning direction to record the red image data on the thermosensitive recording sheet 6 while the latter is being fixed by the support members 4a, 4b and 5a, 5b coupled to respective solenoids 32, 31 through springs 35, 34, respectively. More specifically, the thermal head 1 is first moved to the left (FIG. 1) away from a print starting position S in an exposure zone R (FIG. 2). The thermal head 1 thus moved is detected by the photointerrupter 51. In response to an output signal from the photointerrupter 51, the control unit 8 de-energizes the motor M1 which is positioned near the support member 4b for thereby establishing an initial position for the thermal head 1. In synchronism with the initializing process for the thermal head 1, the control unit 8 applies a signal to the solenoid 33 for pressing the platen 3 against the thermal head 1 through the thermo-sensitive recording sheet 6. Then, the stepping motor M1 is reversely rotated to move the thermal head 1 and the platen 3 in the auxiliary scanning direction (to the right in FIGS. 1 and 2).

The print starting position S is spaced from the initial position for the thermal head 1 by a predetermined distance or number of steps of the stepping motor M1. The moving means including the stepping motor M1 moves the thermal head 1 from the print start position S to the right in FIG. 1, during which the thermal head 1 effects printing and is moved line by line in response to the energization of the step motor M1 through the timing pulleys 64a, 64b, lead screws 61a, 61b and the sleeve nuts 62a, 62b. Because of the spring 62 which resiliently supports the free end of the leg 62b', when the thermal head 1 is moved, the equal forces F1, F2 are applied to the opposite ends of the thermal head 1 to eliminate any angular fluctuation which might be produced in the angular spacing D (which is about 90 as shown in FIG. 3) of the thermal head 1 with respect to the lead screws 61a, 61b under the load imposed upon printing the data on the thermosensitive sheet 6. More specifically, even though the sleeve nut 62a is fixedly secured to the thermal head 1 through the leg 62a' and extends in the axial direction of the lead screw 61a, another sleeve nut 62b is not fixedly secured to the thermal head 1 because of the movable connection between the leg 62b' and the slot C for allowing the leg 62b' to be biasedly movable within the slot C in the directions of the arrow Z (i.e., in the lateral directions of the copying machine). Therefore, even if the lead screw 61b does not extend exactly parallel to the lead screw 61a, the thermal head 1 remains oriented at a right angle to the lead screw 61a without being effected by the lead screw 61b while the driving forces are being applied from the lead screws 61a, 61b to the sleeve nuts 62a, 62b.

Figure 5:
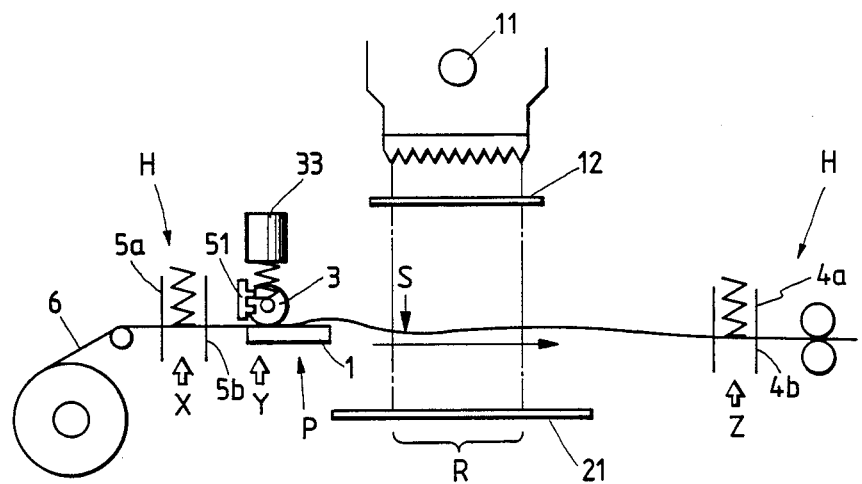
Figure 6:
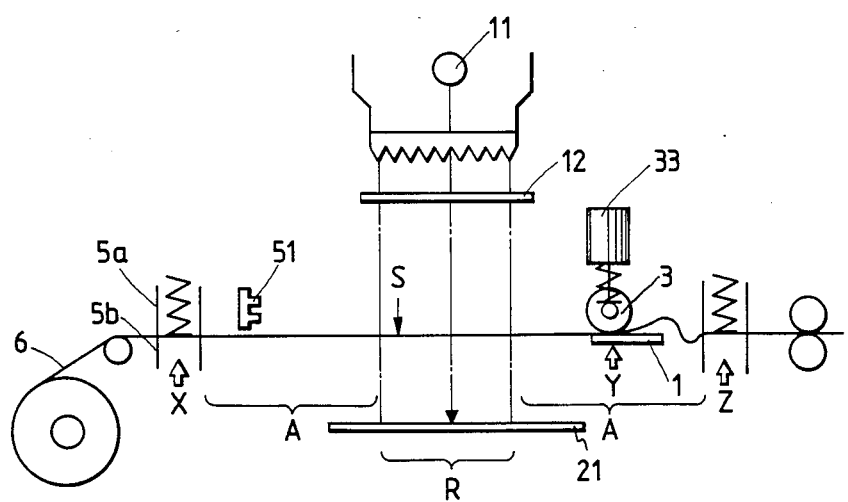

As described above, while the image data is being printed on the thermosensitive recording sheet 6 by the thermal head 1, the thermosensitive recording sheet 6 is fixed in position under tension by the support members 4a, 4b and the support members 5a, 5b. During the printing process, as shown in FIG. 5, a point Y where the thermosensitive recording sheet 6 is subjected to frictional forces by the thermal head 1 is moved to the right between horizontally spaced points X and Z where the thermosensitive recording sheet 6 is fixedly gripped by the support members 5a, 5b and the support members 4a, 4b. Thus, the thermosensitive recording sheet 6 is subjected to tension between the points X, Y, whereas it is slackened between the points Y, Z. After a mask member has been produced by printing the image data in this manner, the thermal head 1 is moved into a righthand space A (FIG. 6) outside of the exposure zone R, and rested in the space A until an exposure process is completed, as shown in FIG. 6. Therefore, the portion of the thermosensitive recording sheet 6 extending in a region between the points X, Y, including the exposure zone R, is therefore kept under tension, and the portion of the sheet 6 lying between the points Y, Z outside of the exposure zone R is slackened. In other words, the mask image is always formed on the tensioned surface of the thermosensitive sheet 6, and such tension is maintainable for the subsequent exposure process without any movement or transfer of the mask carrying sheet 6. As a result, accurate position alignment can be established between the mask image and the photosensitive sheet 21.

As shown in FIGS. 2 and 6, the exposure zone R which includes an area where the image data is printed on the thermosensitive recording sheet 6 is disposed between two spaced thermal head escape spaces A (one of which has been described above). The support members 4a, 4b and the support members 5a, 5b are spaced from the exposure zone R by the respective escape spaces A, in which the thermal head 1 can fully be rested.

After the exposure process, the support members 4a, 5a, and the platen 3 are released to free the thermosensitive recording sheet 6. Then, the thermal head 1 is moved back to the initial position in the lefthand escape space A across the exposure zone R, and at the same time the thermosensitive recording sheet 6 is fed along by an interval such that the previously formed mask member on the sheet 6 will be displaced out of the exposure zone R. Thereafter, the thermosensitive recording sheet 6 is held in position by the support members 4a, 4b and 5a, 5b, and subsequent mask image is formed on the sheet 6 on a basis of next color image data.

The exposure process, after the mask member has been formed on the thermosensitive recording sheet 6 based on the red image data, will be described below.

When the mask image is produced, a photosensitive pressure-sensitive sheet 21 coated with encapsulated coloring materials of cyan, magenta, and yellow is delievered from the sheet cassette 20 into the position below the thermosensitive recording sheet 6 with the photosensitive surface of the sheet 21 facing the mask member on the sheet 6. Then, light from the light source 11 goes through the red filter 12a which only passes a wavelength of 350 nm corresponding to the spectral peak sensitivity at 350 nm of cyan, and also through the sheet 6 which carries the red mask image to the photosensitive pressure-sensitive sheet 21 to selectively photoset cyan microcapsules thereon. After the red image data has been transferred to the photosensitive pressure-sensitive sheet 21, the thermosensitive sheet 6 is released from the support members 4a, 4b, 5a, 5b and the thermal head 1 by the solenoids 31, 32, 33. Then, the thermal head 1 is moved back to the initial position while at the same time the thermosensitive recording sheet 6 is fed along a prescribed distance by the feed rollers 42 driven by the motor M2. After the thermal head 1 having reached the initial position has been detected by the photointerrupter 9, the thermosensitive recording sheet 6 is fixed in position again by the support members 4a, 4b, 5a, 5b, and the platen 3 presses the sheet 6 against the thermal head 1. The thermal head 1 is moved in the auxiliary scanning direction while green image data is printed on the sheet 6 by the thermal head 1, for thereby producing a mask member corresponding to green image data. The green mask member is formed directly above the photosensitive pressure-sensitive sheet 21 without requiring a positioning process which would otherwise be carried out by delicate positional control. Therefore, the color-separated mask members can be registered highly accurately only by controlling the movement of the thermal head 1. No positional control whatsoever is necessary to position the thermosensitive recording sheet 6 after each mask member has been formed. After the green mask member has been produced, the photosensitive pressure-sensitive sheet 21 can immediately be exposed to light having passed through the green mask member.

More specifically, the green filter 12b which only passes a wavelength of 385 nm corresponding to the spectral peak sensitivity at 385 nm of magenta is turned into a position below the light source 11, and light emitted from the light source 11 and passed through the green filter 12b and the sheet 6 carrying the green mask image is applied to the photosensitive pressure-sensitive sheet 21 to selectively photoset magenta microcapsules on the sheet 21 according to the green image data. After the photosensitive pressure-sensitive sheet 21 has been exposed to the green image data, blue image data is supplied from the data input unit 7, and the support members 4a, 5a and the platen 3 are released to allow the green mask member to be moved out of the exposure zone R. The motor M2 is energized by the motor driver 42 to feed the sheet 6, and the thermal head 1 is moved back to the initial position. Then, the sheet 6 is fixed in position by the support members 4a, 4b, and pressed against the thermal head 1 by the platen 3. Thereafter, the thermal head 1 is moved in the auxiliary scanning direction to form a blue mask image on the sheet 6. Finally, light is emitted from the light source 11, and passed through the blue filter 12c which only passes a wavelength of 475 nm corresponding to the spectral peak sensitivity at 475 nm of yellow and the sheet 6 carrying the blue mask image to the photosensitive pressure-sensitive sheet 21 for thereby selectively photosetting yellow microcapsules on the sheet 21. In this fashion, the single photosensitive pressure-sensitive sheet 21 is exposed with light which has passed successively through the red, green, and blue mask members, after which the sheet 21 is fed between the pressure developing rolls 23, 24 by which those microcapsules on the sheet 1 that have not been photoset are ruptured. The coloring materials from the ruptured microcapsules are reacted with the color developer to reproduce a colored image on the sheet 21.

The recording apparatus of the present invention may be also used as a printer rather than a copying machine. The lead screws 61a, 61b for moving the thermal head 1 are disposed one on each side of the thermal head 1, and the sleeve nut 62a on the lead screw 61a is fixed to the thermal head 1 whereas the other sleeve nut 62b on the lead screw 61b is free to move in a direction transverse to the direction in which the thermal head 1 is movable. Therefore, the thermal head 1 is moved accurately along one of the lead screws 61a, and at the same time the driving forces are reliably transmitted from the two lead screws 61a, 61b. Since the lead screws 61a, 61b are not required to lie exactly parallel to each other, and no special guide means is required for guiding the thermal head 1, the costs of manufacture and assembly of the recording apparatus are reduced.

In view of the foregoing, according to the present invention, since after the mask image is formed on the thermosensitive sheet 6, the mask carrying sheet does not undergo any transfer, but can be stationarily held for the subsequent exposure process relative to the photosensitive sheet 21. Therefore, excellent position alignment is achievable between two sheets 6 and 21. Further, since the mask image is always formed on the tension-applied surface of the thermosensitive sheet 6, quite accurate mask image can be provided thereon.

Although a certain preferred embodiment has been shown and described, it should be understood that many changes and modifications may be made therein without departing from the spirit and scope of the invention.

What is claimed is:

1. An image recording apparatus which produces an image on a photosensitive recording medium through a light transmissive member which carries thereon a light shieldable mask image, comprising:
   a mask image forming means provided at a mask image forming zone for forming said light shieldable mask image on said light transmissive member, said light shieldable mask image corresponding to color information derived from a colored original;
   exposure means for exposing said photosensitive recording medium to light through said light transmissive member carrying said mask image in an exposure zone for forming a latent image on said photosensitive recording medium corresponding to said mask image, said mask image forming zone being identical with said exposure zone;
   developing means disposed at a downstream side of said exposure means for developing said latent image into a visible image on said photosensitive recording medium; and,
   a holding means for selectively holding portions of said light transmissive member extending outside of said exposure zone and maintaining a segment of said light transmissive member stationary in said exposure zone during the mask image formation and during the exposure in accordance with said color information.

2. The image recording apparatus as defined in claim 1, wherein said mask image forming means comprises:
   a thermal print head for printing an image on said light-transmissive member to thus form said light shieldable mask image thereon;
   a platen supported on said thermal print head and selectively biased toward said thermal print head for pressing said light transmissive member between said platen and thermal print head during said mask image formation; and, a moving means connected to said thermal print head for moving said thermal print head in a lengthwise direction of said light transmissive member.

3. The image recording apparatus as defined in claim 2, wherein said moving means comprises;

a drive source;

a pair of guide screws connected to said drive source and rotatable about their axes by said drive source;

a pair of sleeve nuts threadingly engaged with said guide screws, said pair of sleeve nuts being movable in axial direction of said guide screws upon rotations thereof; and;

leg members extending from said pair of sleeve nuts, one of said leg members being fixedly coupled to one end portion of said thermal print head, and another leg member being movably connected to another end portion of said thermal print head.

4. The image recording apparatus as defined in claim 2, wherein said thermal print head is movable between first and second rest positions outside of said exposure zone.

5. The image recording apparatus as defined in claim 4, wherein said holding means is positioned outside of said first and second rest positions.

6. The image recording apparatus as defined in claim 5, wherein said holding means comprises a first holding unit for holding a first portion of said light transmissive member, and a second holding unit for holding a second portion of said light transmissive member; said first holding unit comprising a first lower stationary holder, a first upper movable holder, and a first solenoid connected to said first upper movable holder for selectively moving said upper holder toward said lower holder to thereby nip said first portion therebetween, said second holding unit comprising a second lower stationary holder, a second upper movable holder, and a second solenoid connected to said second upper movable holder for selectively moving said second upper holder toward said second lower holder to thereby nip said second portion therebetween.

7. The image recording apparatus as defined in claim 3, wherein said thermal print head has a base portion formed with a slot extending in a direction perpendicular to said guide screws, and further comprising a coil spring disposed in said slot for biasing said another leg member and for providing a connection between said another leg member and said base portion of said thermal print head.

8. The image recording apparatus as defined in claim 1, wherein said photosensitive recording medium comprises a self-contained type recording medium in which an encapsulated chromogenic material and a developer material are co-deposited on one surface of a single substrate; said exposure means providing said latent image on said selfcontained type recording medium and said developing means providing said visible image on said recording medium.

9. The image recording apparatus as defined in claim 1, wherein said photosensitive recording medium comprises a separate type recording medium in which an encapsulated chromogenic material is deposited on a first substrate and a developer material is coated on a second substrate as a separate developer sheet, said latent image being provided on said first substrate by said exposure means, and said visible image being provided on said second substrate by said developing means; and further comprising a means for feeding said separate developer sheet to said image developing means for superposing with said first substrate, whereby said visible image is formed on said separate developer sheet.

10. The image recording apparatus as defined in claim 1, wherein said light transmissive member is a continuous web of thermosensitive recording sheet selectively supplied into said mask image forming zone and exposure zone from a sheet supply roll and from said mask image forming zone and exposure zone onto a sheet takeup roll.

11. The image recording apparatus as defined in claim 1, wherein said exposure means is operative to expose said photosensitive recording medium to red, green and blue light successively through light shieldable masks formed on said light transmissive member corresponding, respectively, to red, green and blue color information derived from said colored original.

12. The image recording apparatus as defined in claim 10, wherein said exposure means is operative to expose said photosensitive recording medium to red, green and blue light successively through light shieldable masks formed on said continuous web of thermosensitive recording sheet corresponding, respectively, to red, green and blue color information derived from said colored original.

* * * * *